United States Patent
Bachman et al.

(10) Patent No.: US 8,378,485 B2
(45) Date of Patent: Feb. 19, 2013

(54) SOLDER INTERCONNECT BY ADDITION OF COPPER

(75) Inventors: Mark A. Bachman, Sinking Spring, PA (US); John W. Osenbach, Kutztown, PA (US); Kishor V. Desai, Fremont, CA (US)

(73) Assignee: LSI Corporation, Milpitas, CA (US)

(*) Notice: Subject to any disclaimer, the term of this patent is extended or adjusted under 35 U.S.C. 154(b) by 296 days.

(21) Appl. No.: 12/501,686

(22) Filed: Jul. 13, 2009

(65) Prior Publication Data

US 2011/0006415 A1 Jan. 13, 2011

(51) Int. Cl.
*H01L 23/48* (2006.01)

(52) U.S. Cl. .......... 257/737; 257/E23.141; 257/E23.157

(58) Field of Classification Search ................. 257/737, 257/E23.141, E23.157
See application file for complete search history.

(56) References Cited

U.S. PATENT DOCUMENTS

| | | | |
|---|---|---|---|
| 5,466,635 A | 11/1995 | Lynch et al. | |
| 5,604,161 A | 2/1997 | Barber | |
| 5,667,132 A | 9/1997 | Chirovsky et al. | |
| 5,741,726 A | 4/1998 | Barber | |
| 5,891,756 A * | 4/1999 | Erickson | 438/108 |
| 5,918,794 A | 7/1999 | D'Asaro et al. | |
| 6,013,713 A | 1/2000 | Cotte et al. | |
| 6,143,991 A * | 11/2000 | Moriyama | 174/261 |
| 6,221,692 B1 * | 4/2001 | Shoji et al. | 438/106 |
| 6,689,680 B2 | 2/2004 | Greer | |
| 6,919,264 B2 * | 7/2005 | Brintzinger et al. | 438/614 |
| 7,443,040 B2 * | 10/2008 | Lo | 257/780 |
| 2001/0040290 A1 * | 11/2001 | Sakurai et al. | 257/737 |
| 2002/0086520 A1 * | 7/2002 | Chiang | 438/630 |
| 2003/0030149 A1 * | 2/2003 | Miura et al. | 257/772 |
| 2003/0193094 A1 | 10/2003 | Takahashi et al. | |
| 2003/0219623 A1 | 11/2003 | Kao et al. | |
| 2007/0057022 A1 | 3/2007 | Mogami et al. | |
| 2007/0238283 A1 | 10/2007 | Chen et al. | |
| 2008/0157395 A1 | 7/2008 | Belanger et al. | |
| 2008/0308297 A1 | 12/2008 | Jurenka et al. | |
| 2010/0155941 A1 | 6/2010 | Matsuki et al. | |

FOREIGN PATENT DOCUMENTS

| | | |
|---|---|---|
| DE | 102005055488 A1 | 1/2007 |
| EP | 2003045908 | 2/2003 |
| EP | 1223613 A2 | 7/2003 |
| WO | 2009013826 A1 | 1/2009 |

OTHER PUBLICATIONS

Choi, Won Kyoung, et al., "Study of IMC Morphologies and Phase Characteristics Affected b y the Reactions of Ni and Cu Metallurgies wiht Pb-Free Solder Joints"; 2003 Electronics Components and Technology Conference—XP010648074, pp. 1190-1196.

Jurenka, Claudia, et al., "Effect of the Cu Thickness on the Stabiity of a Ni/Cu Bilayer UBM of Lead Free Microbumps During Liquid and Solid State Aging", XP010808638—Electronic Components and Technology Conference, 2005, pp. 89-93.

Jim, Y.G., et al., "Investigation of Sn/Cu/Ni Ternary Alloying in Lead Free Solder Bump Applications", Electronic Packaging Technology, 2006—XP031087682, pp. 1-4.

(Continued)

*Primary Examiner* — Lex Malsawma

(57) ABSTRACT

A method of forming an electronic device provides an electronic device substrate having a solder bump pad located thereover. A nickel-containing layer is located over the solder bump pad. A copper-containing layer is formed on the nickel-containing layer prior to subjecting the electronic device to a reflow process.

23 Claims, 4 Drawing Sheets

OTHER PUBLICATIONS

Sohn, Yoon-Chul, et al,; "Effect of Intermetallics Spalling on the Mechanical Behavior of Electroless Ni(P)/Pb-free Solder Interconnection"; 2005 Electronic Components and Technology Conference (XP002626613) IEEE, pp. 83-88.

Shangguan, Dongkai; "Lead-Free Solder Interconnect Reliability"; EDFAS, ASM International, Jul. 2006; pp. 34-37.

* cited by examiner

US 8,378,485 B2

SOLDER INTERCONNECT BY ADDITION OF COPPER

TECHNICAL FIELD

This application is directed, in general, to electronic packaging, and more specifically to flip-chip assembly.

BACKGROUND

Flip-chip packaging relies on solder to connect the IC to the package. These solder interconnects are called bumps. The bumps have traditionally been made of Pb/Sn alloys. However, with the advent of legislation restricting the use of lead, the electronics industry is being pushed to Pb-free alloys. For example, the Restriction of Hazardous Substances (RoHS) directive, adopted by the European Union in 2003, restricts the concentration of lead in any homogeneous component to 0.1% (1000 ppm) or less. The most prevalent Pb-free bump alloys are ternary Sn/Ag/Cu and binary Sn/Ag. The Sn/Ag alloys are typically plated, while the Sn/Ag/Cu alloys are typically paste printed. In the case of plated Sn/Ag, the under-bump metallization (UBM) is typically a tri-layer of Ti/Cu/Ni; for the Sn/Ag/Cu alloy, the UBM is typically Al/Ni/Cu.

SUMMARY

One aspect provides a method of forming an electronic device. An electronic device substrate is provided that has a solder bump pad located thereover and a nickel-containing layer located over said solder bump pad. The method includes forming a copper-containing layer on said nickel-containing layer prior to subjecting said electronic device to a reflow process.

Another aspect provides an electronic device. The electronic device includes an electronic device substrate with a bump pad located thereover. A nickel-containing layer is located on the solder bump pad, and a copper-containing layer is located on the nickel-containing layer.

Another aspect provides a method of forming an electronic device. The method includes providing an electronic device substrate having a solder bump located thereover. A copper-containing layer is formed on the solder bump.

BRIEF DESCRIPTION

Reference is now made to the following descriptions taken in conjunction with the accompanying drawings, in which.

Figure 3:
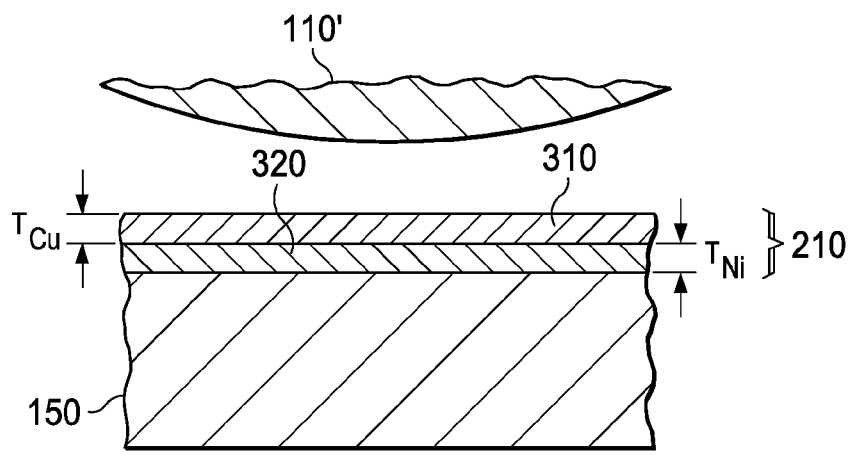
Figure 4A:
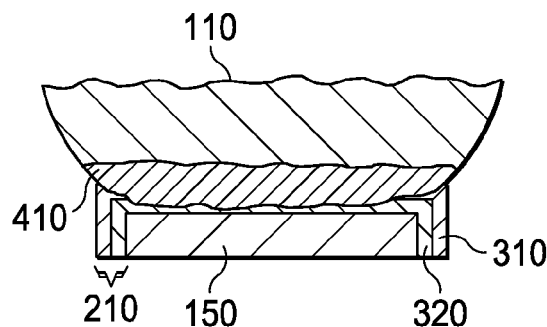
Figure 4B:
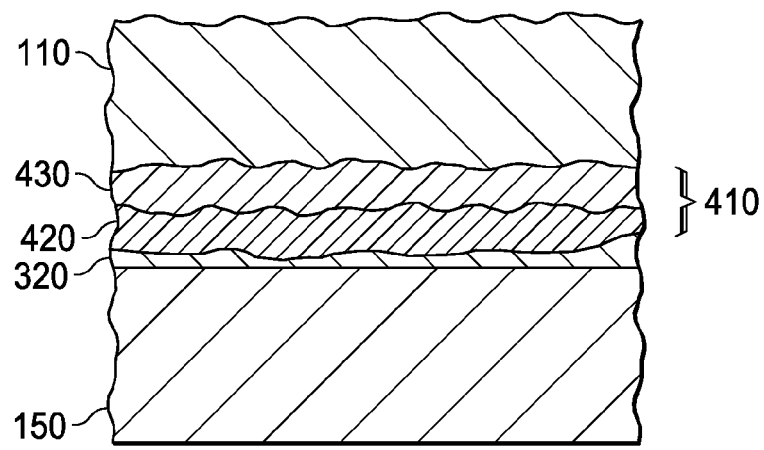
Figure 6A:
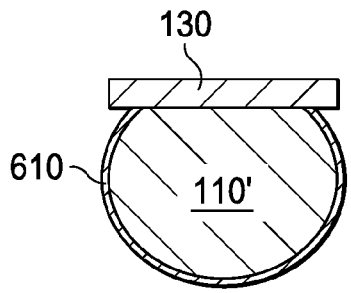
Figure 6B:
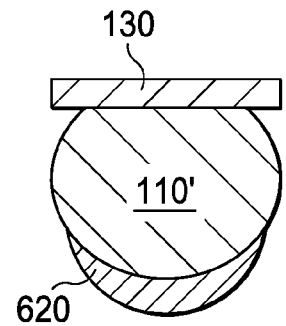
Figure 7:
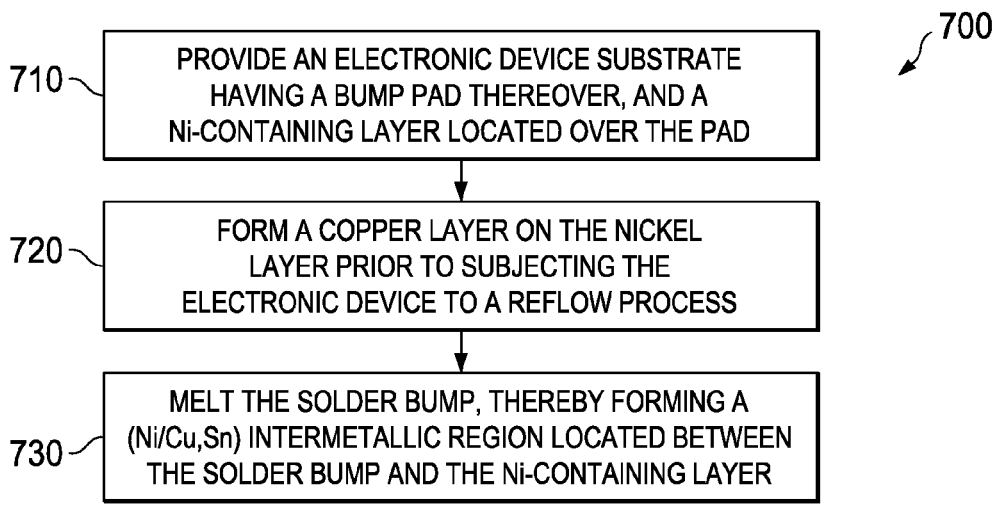
Figure 8:
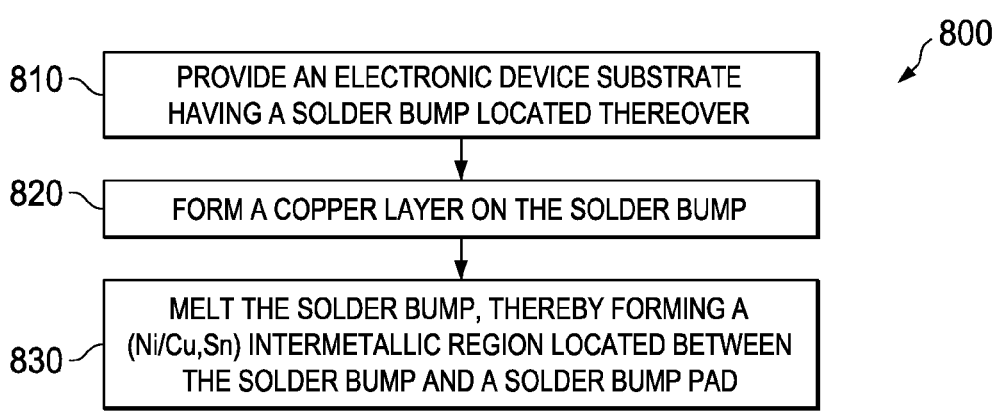

FIG. 3 provides a detailed view of a bump pad;

FIG. 4A illustrates a solder bump and a bump pad with an intermetallic compound (IMC) region therebetween;

FIG. 4B illustrates a detailed view of the IMC region;

FIGS. 6A and 6B illustrate a copper-containing layer formed on a solder bump; and FIGS. 7 and 8 illustrate methods of the disclosure.

DETAILED DESCRIPTION

Under some circumstances, solder bumps may fail before the end of a design life of an electronic device. Some failures are attributable to formation of mechanically weak regions within the failing solder bump by solid-state mechanisms. A weak region may fracture under, e.g., residual mechanical stress remaining from the device assembly, or caused by thermal expansion during device operation. However, conventional approaches to reducing bump failure suffer from several deficiencies.

In one conventional approach, a Ni layer over a Cu bump pad is made thin enough that the solder melt completely removes the Ni layer in some locations, exposing the underlying Cu to the bump. Some of the Cu is incorporated into a Sn/Cu IMC region between the bump and the pad. At a low concentration, some Cu in the IMC region may be beneficial. However, because Cu rapidly reacts with Sn and Ag of the molten solder, the amount of Cu dissolved into the melt is poorly controlled. Excessive Cu incorporation can lead to another class of reliability issues.

In another conventional approach, to avoid consuming Cu from the pad a Ni/Au layer or a Ni/Pd/Au layer is formed on top of the Cu pad. In this case, the Ni and/or Pd layers are formed with a thickness sufficient to ensure that Cu is not exposed during reflow. While this approach reduces reliability issues related to too great a Cu concentration in the solder bump, the fracture issue described previously is not ameliorated. Embodiments described herein address these limitations of conventional approaches.

It is presently recognized that Cu may be added to a Sn/Ag solder bump in a controlled fashion by forming a copper-containing layer on the solder bump, or on a bump pad to which the bump is joined, prior to reflowing the solder bump. The copper-containing layer is at least partially consumed by the solder melt, forming a ternary Sn/Ag/Cu (SAC) alloy in the solder bump and an intermetallic compound (IMC) region between the solder bump and the bump pad. The IMC region has mechanical properties that improve the mechanical and electrical reliability of the joint between the bump and the pad relative to conventional Pb-free bump solder joints. Such improved properties are expected to reduce the incidence of bump failure and increase the projected operating lifetime of packaged devices.

Figure 1:
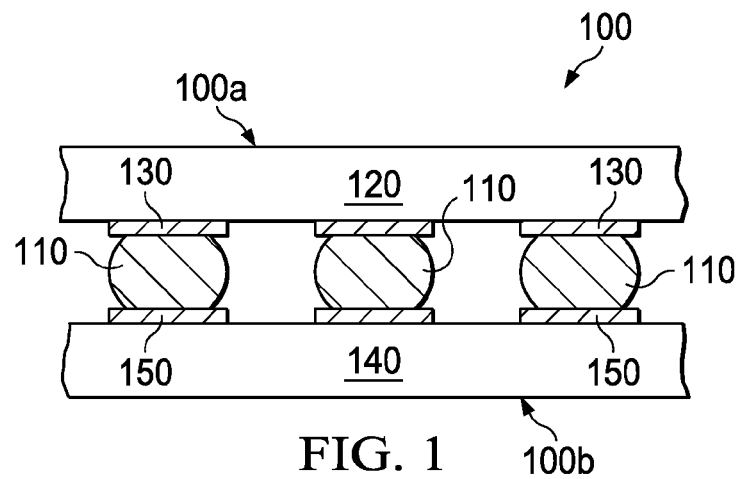
FIG. 1 illustrates an electronic device having solder bumps formed according to the disclosure.

Turning initially to FIG. 1, illustrated is an assembled electronic device 100. The device 100 includes a first electronic device 100a and second electronic device 100b. In some embodiments, the device 100a is an integrated circuit (IC) die, and the device 100b is an electronic device package. In the illustrated embodiment, the device 100a is inverted and a solder bump 110 is located between the device 100a and the device 100b. In some embodiments the solder bump 110 complies with RoHS standards. As used in this discussion and in the claims, an RoHS-compliant solder bump is regarded as Pb-free. The devices 100a, 100b were joined, e.g., by a solder reflow process, in which the solder bump 110 was melted and cooled. The process of joining electronic devices in this configuration is commonly referred to as "flip-chip" assembly.

The device 100a includes a substrate 120 and a plurality of solder bump pads 130. As used herein and in the claims, a bump pad is a metal pad configured to form a connection to a solder bump and located over an electronic device substrate. The electronic device may be, e.g., an IC die or an electronic package. The pad may be, e.g., 50 μm or more on a side, and may include various metal layers thereover, such as under-bump metallization or oxidation inhibitors. The solder bump pads 130 are formed over a top metal interconnect layer (not shown) of the substrate 120. In some embodiments, the substrate 120 is an integrated circuit, and may include, e.g., transistors and metal interconnect levels. A top metal interconnect layer connected to the pads 130 may be an I/O pad or interconnect level at the top of a multi-layer interconnect stack.

The device 100b includes a substrate 140 and a plurality of bump pads 150. In some embodiments, the device 100b is an electronic device package. The substrate 140 may include, e.g., package leads and signal routing traces connecting the leads to the bump pads 150. The substrate 140 may include multiple signal routing layers within the device package substrate. A signal routing interconnect layer may connect to the pads 150 by, e.g., via connections.

Figure 2A:
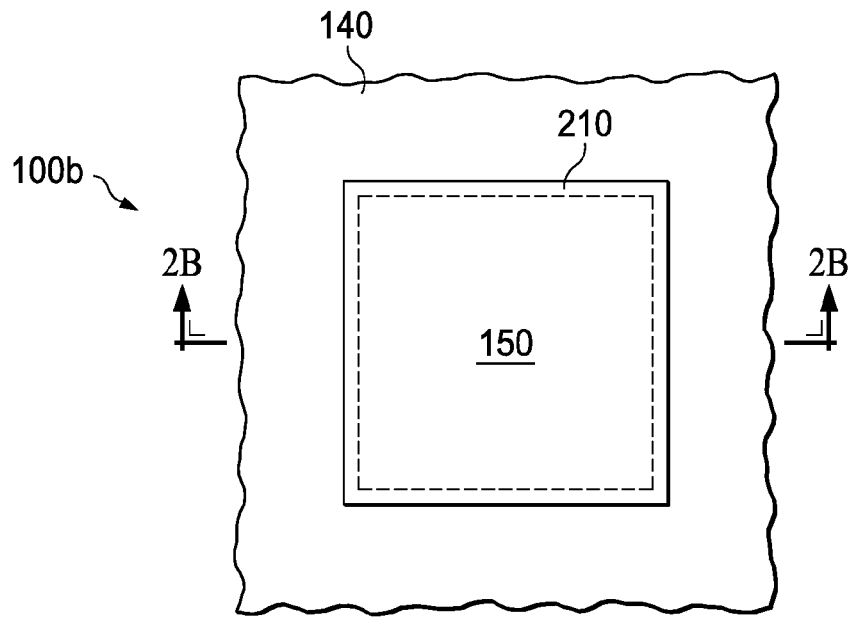
FIGS. 2 and 5 illustrate a bump pad of the disclosure.
Figure 2B:
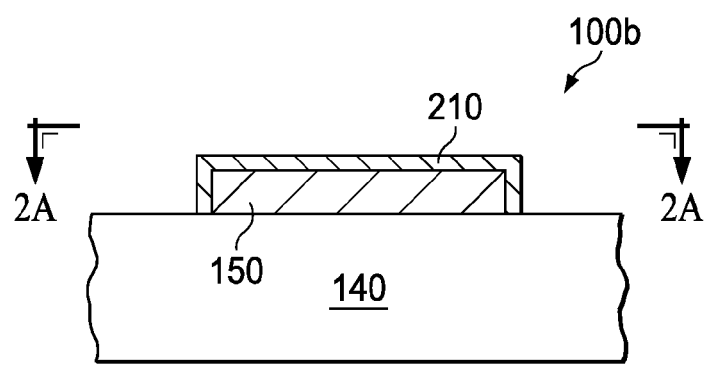

FIGS. 2A and 2B illustrate a plan and a sectional view, respectively, of the bump pad 150 and a portion of the substrate 140 prior to assembly. The pad 150 is illustrated as formed on and extending above the upper surface of the substrate 140. Other contemplated embodiments include those in which the upper surface of the pad 150 is about flush with the substrate 140. The pad 150 may be, e.g., an Al or Cu pad, depending on the process technology used to form the device 100b. A metal layer 210 is located over the pad 150. The layer 210 is deposited or formed on the pad 150 prior to joining a solder bump to the pad 150. While illustrated covering the top and sides of the pad 150, in other embodiments the metal layer 210 may cover only the top of the pad 150, or only a sufficient portion of the top 150 to prevent contact between the solder bump 110 and the pad 150. Moreover, additional metal layers, not shown, may be present between the metal layer 210 and the pad 150. Such layers may be used in some cases to promote adhesion or to form a diffusion barrier between the metal layer 210 and the pad 150.

As described further below, the layer 210 includes a copper-containing sub-layer and a nickel-containing sub-layer. The layer 210 may additionally include one or more metal layers selected to impart characteristics to an electrical and mechanical connection between the solder bump 110 and the substrate 140. For example, the layer 210 may include a metal layer that improves wetting of the solder bump 110.

FIG. 3 illustrates the metal layer 210 in greater detail as configured in one embodiment of the disclosure. A copper-containing sub-layer 310 is located between a solder bump 110' and a nickel-containing sub-layer 320. In the following discussion, the "prime" designation with respect to the solder bump 110 refers thereto prior to joining the device 100a to the device 100b. As used in the disclosure and in the claims, a copper-containing layer may include elemental copper, compounds containing copper, e.g., copper-containing IMCs, or non-copper binders. Furthermore, a copper-containing layer may include two or more layers with different copper-containing compositions, e.g., a layer of elemental copper and a layer containing copper IMCs. Likewise, as used in the disclosure and in the claims, a nickel-containing layer may include elemental Ni or compounds containing Ni, e.g., nickel-containing IMCs. Furthermore, a nickel-containing layer may include two or more layers with different nickel-containing compositions, e.g., a layer of elemental nickel and a layer containing nickel IMCs. For brevity, the sub-layer 310 may be referred to in the remaining discussion as a Cu sub-layer, and the sub-layer 320 may be referred to as a Ni sub-layer without loss of generality.

In the illustrated embodiment, the Cu sub-layer 310 is located on the Ni sub-layer 320, and between the sub-layer 320 and the bump 110'. Known flip-chip processes do not include a copper-containing layer between the solder bump and a nickel-containing layer on the bump pad. The Cu sub-layer 310 has a thickness $T_{Cu}$ that is determined to provide an amount of Cu that will result in a concentration of Cu in the bump 110 after reflow in a range of about 0.5 wt % to about 4 wt %. This aspect is treated in greater detail below. The Ni sub-layer 320 has a thickness $T_{Ni}$ sufficient to ensure that the sub-layer 320 will remain unbroken after reflow so that the pad 150 does not contact the molten bump 110.

Regarding the embodiment of FIG. 3, optionally, one or more additional metal layers may be located between the Cu sub-layer 310 and the Ni sub-layer 320. For example, such one or more layers may be comprised by a finish including, e.g., a Pd layer, an Au layer or both. Such layers are sometimes used to prevent oxidation of bump pads or promote wetting of the pad. As used in the disclosure and in the claims, the Cu sub-layer 310 is located on the Ni sub-layer 320 even when additional metal layers customarily used as finish layers, e.g., Au and/or Pd, are located between the sub-layers 310, 320.

In some embodiments discussed below, a copper-containing layer may be deposited or formed on the solder bump 110' prior to conducting the assembly process. In some embodiments the solder bump 110' is essentially free of Cu before joining the bump 110' to the pad 150. Essentially free means that a concentration of Cu in the solder bump 110' does not exceed about 0.1 wt %. In a nonlimiting example, the solder bump 110' is about 96.5 wt % Sn/3.5 wt % Ag (eutectic composition) before reflow. A solder bump that is otherwise essentially free of Cu is not regarded as containing Cu by the presence of a copper-containing layer formed thereon.

FIG. 4A illustrates a solder bump 110 over the pad 150 after forming a solder joint, e.g., after reflow. The composition of the solder bump 110 differs from the composition of the solder bump 110' due to incorporation of a portion of the metal layer 210. The metal layer 210 is shown without limitation as including the Cu sub-layer 310 and the Ni sub-layer 320. Reaction between the molten solder and the sub-layers 310, 320 during the reflow process produces a copper-containing IMC region 410 when Sn and/or Ag in the solder bump 110' reacts with Ni and/or Cu in the metal layer 210. IMCs may include, e.g., compounds containing Cu, Sn, Ag and/or Ni. Each compound is associated with a characteristic stoichiometry of constituent elements. Substantially all the sub-layer 310 between the solder bump 110 and the sub-layer 320 is expected to be consumed by the melt and incorporated into the region 410 and the solder bump 110. If present, a wetting layer formed on the Cu sub-layer 310 is also consumed. The Ni sub-layer 320 is essentially unbroken, meaning, e.g., that a continuous portion of the Ni sub-layer 320 is located between the region 410 and the pad 150.

The region 410 is distinguishable from the solder bump 110 by the presence of the various IMCs therein. In general, the boundary of the IMC region 410 is expected to be sharp, as determined by various analytic techniques such as transmission electron microscopy. Typically, the region 410 has a total mass about 0.1%-10% that of the solder bump 110.

FIG. 4B illustrates the IMC region 410 in greater detail. A first subregion 420, sharing an interface with the Ni sub-layer 320, is expected to consist substantially of Ni/Sn compounds, e.g., $Ni_3Sn_4$. A second subregion 430, located between the subregion 420 and the bump 110, is expected to consist substantially of Cu/Sn compounds, e.g., $Cu_6Sn_5$, with some Ni substitution for Cu. IMCs in the subregion 430 may be referred to as (Ni,Cu)/Sn compounds to reflect the presence of Ni in some amount. However, substantially less than 50% of the Cu in the subregion 430 is expected to be substituted with Ni, so for the purposes of this discussion and the claims the subregion 430 is not a nickel-containing layer. The concentration of Cu in the subregion 430 may be, e.g., in a range of about 55 wt % to about 65 wt %. In various embodiments, and for the purpose of the claims, the subregion 430 is regarded as a copper-containing layer, reflecting the high concentration of Cu therein. On the other hand, the solder bump 110 is not considered a copper-containing layer. The bump 110 has a copper concentration less than about 5 wt %, and the copper therein is typically in solid solution and does not form copper-containing IMCs. To the extent that any copper-containing IMCs do form in the bump 110, such IMCs are widely dispersed and do not form a continuous layer.

When the molten solder bump 110' is placed in contact with the layer 210, the Cu in the sub-layer 310 dissolves into and reacts with Sn and/or Ag in the solder bump 110' thus forming the solder bump 110. The diffusion rate of Cu in the molten solder bump 110 is thought to be greater than about 0.1 µm/s. A typical solder reflow process in a bump assembly process maintains the solder bump 110 at a temperature above about 220 C for 60-90 s. Thus, the Cu in the sub-layer 310 that is not bound in IMCs in the subregion 430 is expected to form a SAC alloy with the Sn and Ag in the solder bump 110. The alloy is expected to have a uniform distribution of Cu therein. When the Cu sub-layer 310 is consumed by the molten solder, the solder contacts the Ni sub-layer 320. Sn in the solder reacts with the Ni in the sub-layer 320 to form Ni/Sn IMCs, including $Ni_3Sn_4$ in the subregion 420.

The Ni/Sn IMC in the subregion 420, e.g., $Ni_3Sn_4$, may continue to form over the life of the device 100, as Ni from the pad 150 and Sn from the bump 110 diffuse into the subregion 420. Thus, the subregion 420 may grow in thickness over time. The Ni/Sn IMCs are typically brittle, and if the subregion 420 becomes thick enough the subregion 420 may fracture under stress. The fracture may cause the device 100 to fail before the end of its rated life is reached.

However, unlike the conventional case, the presence of the subregion 430 is thought to suppress the growth of the subregion 420. It is thought that the Cu/Sn IMCs in the subregion 430 also continue to form over time by solid state mechanisms. The Cu in the solder bump 110 provides Cu to the subregion 430 over the lifetime of the device 100, allowing the subregion 430 to grow. The subregion 430 may act as at least a partial sink of Sn from the bump 110 that would otherwise diffuse into the subregion 420. Limiting the availability of Sn to the subregion 420 is expected to limit the growth rate of the subregion 420, thus reducing the incidence of failure of the device 100. Moreover, the Cu/Sn IMCs in the subregion 430 are expected to be more mechanically tough than the Ni/Sn IMCs of the subregion 420, so the growth of the subregion 430 is not expected to detrimentally affect the reliability of the device 100.

Alloying the solder bump 110' with Cu before reflow is incompatible with preferred manufacturing methods. Manufacturers strongly prefer electroplating solder when forming the solder bump 110' for low cost and high throughput. But inherent differences in electrochemical potential of Sn, Ag and Cu effectively prevent formation of solder bumps with a stable concentration of Sn, Ag and Cu.

Embodiments of this disclosure overcome these deficiencies by providing the Cu sub-layer 310 as a source of Cu prior to assembling the devices 100a, 100b. Thus, the bump 110' may be formed by a conventional process, e.g., electroplating, and the alloying occurs during reflow when the devices 100a, 100b are joined.

The Cu sub-layer 310 may be formed by any conventional or novel method. In some embodiments, the sub-layer 310 is formed by electroplating. In another embodiment, the sub-layer 310 is formed by stencil printing of a copper-containing paste. The thickness of the sub-layer 310 is generally determined by the concentration of Cu desired in the bump 110. The thickness of the Cu sub-layer 310 may be different for various forming methods. For example, an electroplated layer typically has a very uniform thickness over the scale of the pad 150 (≈100 µm). Since all the Cu is expected to be consumed by the melt, the thickness may be determined by one skilled in the art, with knowledge of the volume and composition of the solder bump 110'.

In a nonlimiting example, a thickness of 0.5-2 µm may be used for an electroplated Cu sub-layer 310 for a 100 µm solder bump 110'. This thickness range is expected to result in a concentration of Cu in the bump 110 in a range of about 0.5 wt % to about 4 wt %. In some cases a thickness of at least 1 µm may be preferable to account for, e.g., variation of solder bump size. In some cases, the Cu concentration may be limited to 3 wt % or less to minimize the possibility of bump failure due to excessive Cu. In the embodiments herein, the thickness of the sub-layer 310 limits the available Cu to less than the solubility limit of Cu in the solder composition of the bump 110. Thus, the aforementioned reduction of device 100 reliability due to Cu concentration in the bump 110 is obviated.

The rate at which Ni in the nickel containing sub-layer 320 dissolves into the bump 110 is expected to be significantly less than, e.g., less than 10%, that of Cu. Thus, the sub-layer 320 may be relatively thin, compared to the Cu sub-layer 310, and still prevent the molten solder from reaching the pad 150. The total amount of the sub-layer 320 that is consumed will in general also be a function the reflow temperature and time. In some embodiments, the thickness of the sub-layer 320 is sufficient to remain unbroken at the maximum time and temperature anticipated by the tolerance limits of the reflow process. In general, however, it is desirable to limit the thickness of the sub-layer 320 to control the overall cost of the packaging process. In some embodiments, the thickness of the sub-layer 320 before reflow is at least about 20% greater than the maximum expected removal of the Ni.

About 50 nm of the Ni sub-layer 320 is expected to be consumed during the reflow process discussed above. Thus, in some embodiments, the sub-layer 320 has a thickness of about 0.5 µm, reflecting a balance of the aforementioned considerations. The sub-layer 320 may be formed conventionally, e.g., by a physical vapor deposition process.

As described previously, the layer 210 may include, e.g., a Pd layer and/or an Au layer between the sub-layers 310, 320. When present these additional layers may be conventionally formed. In such embodiments, the Cu, Au and Pd layers are expected to be completely consumed, and the Ni layer partially consumed as described previously.

Figure 5A:
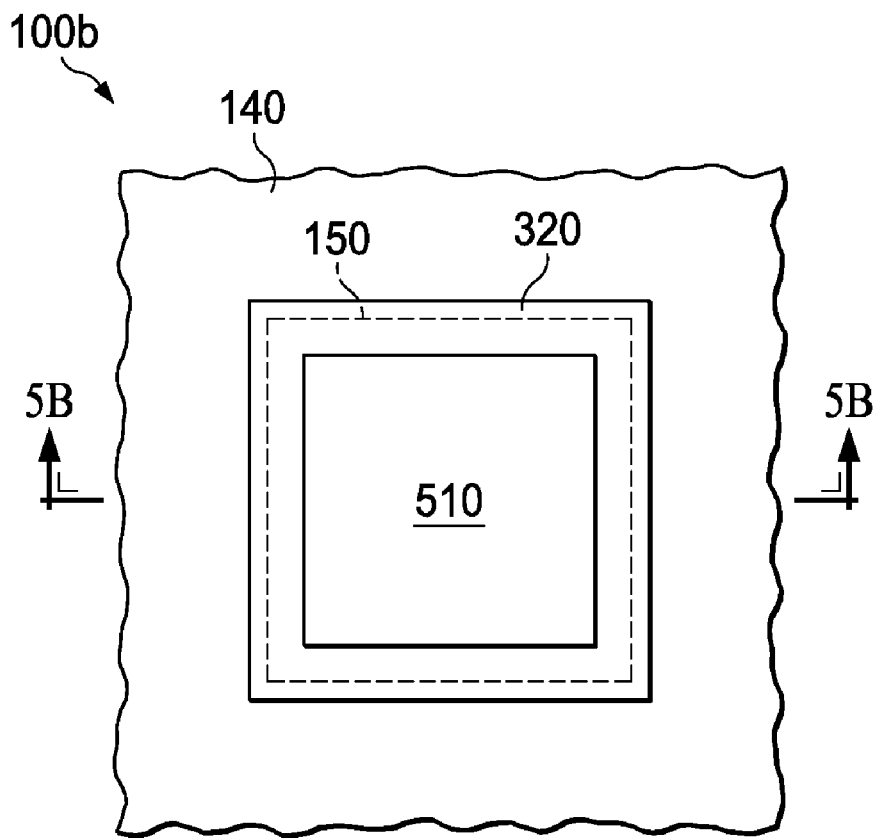
Figure 5B:
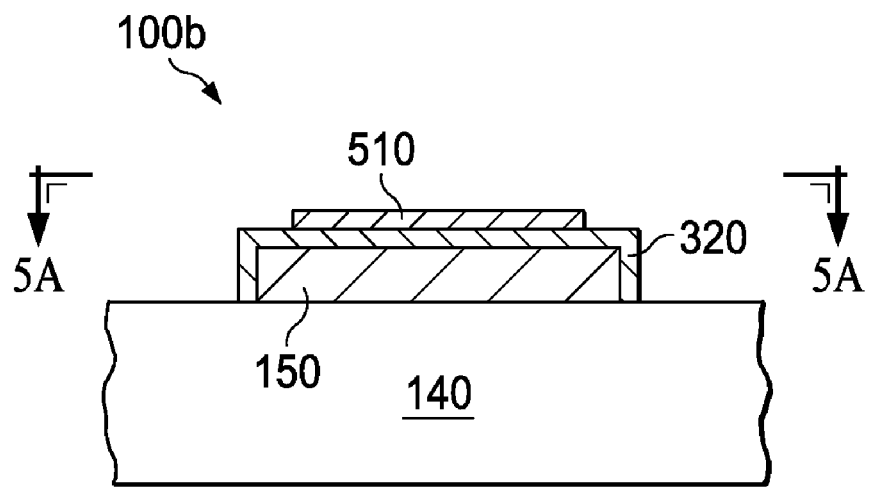

FIGS. 5A and 5B illustrate a plan and a sectional view, respectively, of an embodiment of the bump pad 150 on which a Cu sub-layer 510 is formed on the Ni sub-layer 320 by stencil printing. The thickness of the Cu sub-layer 510 may differ from that of the Cu sub-layer 310. For instance, a density of Cu in a copper-containing paste that is printed onto the Ni sub-layer 320 may be less than the density of Cu in an electroplated film because of free space between Cu particles and the presence of a carrier fluid or biding agent. Moreover, the thickness uniformity of the paste may be lower than that of the electroplated Cu. In some cases, as illustrated in FIG. 5, the printed Cu sub-layer 310 may not cover the entire bump pad 150. In such a case, a volume of the paste layer may, with knowledge of the density of Cu in the paste, be determined that provides the desired concentration of Cu in the solder bump 110.

FIGS. 6A and 6B illustrate alternate embodiments of providing Cu to the solder bump 110. In FIG. 6A, a copper-containing layer 610 is formed on the bump 110'. In some embodiments the bump remains solid during the forming of the copper-containing layer 610. When the solder bump is placed in contact with a Ni layer on a bump pad and reflowed, the layer 610 will provide Cu to the bump 110 in a manner analogous to the embodiments in which the Cu sub-layer 310 is formed on the Ni sub-layer 320. The thickness of the layer 610 may be determined that results in the desired concentration of Cu in bump 110. The embodiment of FIG. 6A may result in a more uniform concentration of Cu in the solder bump 110 than some other embodiments, due to diffusion of Cu into the solder bump 110 over the entire surface thereof.

The copper-containing layer 610 may be formed on the solder bump 110' by, e.g., electroplating. In a nonlimiting example, the solder bump 110' is treated as spherical with a diameter of 100 µm. A thickness of about 30 nm of the layer 610 is expected to result in an average concentration of Cu in the solder bump 110 of about 1 wt %. A thickness of the layer 610 in a range of about 15 nm to about 120 nm provides Cu with a mass in a range of about 0.5% to about 4% of the bump 110' mass. Thus, after reflow, the bump 110 is expected have an average concentration of Cu in a range of about 0.5 wt % to about 4 wt %. Those skilled in the art are able to determine the layer 610 thickness to produce a desired Cu concentration in the solder bump 110.

FIG. 6B illustrates an embodiment in which a copper-containing layer is a bead 620 of a Cu paste formed on the solder bump 110'. The bead 620 may be applied by, e.g., dipping a solder bump array into a copper-containing slurry spread onto a flat surface. For example, a stencil-printing paste may be used as the slurry. Again, when placed in contact with a Ni layer and reflowed, the bead 620 is expected to provide Cu to form the IMC region 410 as previously described. This embodiment may provide a particularly economical means to provide Cu to the bump 110' during reflow.

Turning now to FIG. 7, a method 700 of the disclosure is illustrated. In a step 710, an electronic device substrate is provided that has a bump pad located thereover. The device may be, e.g., an IC die. As used in this disclosure and in the claims, "provided" or "providing" means that a device, substrate, structural element, etc., may be manufactured by the individual or business entity performing the disclosed methods, or obtained thereby from a source other than the individual or entity, including another individual or business entity. The bump pad includes a nickel-containing layer thereover, such as the Ni sub-layer 320. In some embodiments, the nickel-containing layer has a layer of Au and/or Pd thereover.

In a step 720, a copper-containing layer is formed on the nickel-containing layer prior to subjecting the electronic device to a reflow process. The copper-containing layer may be formed conventionally as previously described, e.g., electroplating or stencil printing. Those skilled in the art will appreciate that these examples are not exclusive of other equivalent methods that are within the scope of the disclosure.

In some embodiments the method 700 continues with a step 730, in which the solder bump is formed over the bump pad. The bump may be reflowed, e.g. melted, thereby forming an (Ni,Cu)/Sn IMC region between the bump and the nickel-containing layer. The IMC region may contain Cu in a concentration between about 55 wt % and about 65 wt %. The melting may join the electronic device and the device package. The bump may be located over an IC die or a device package substrate. The solder bump may be essentially free of Cu, e.g., formed from a Sn/Ag solder alloy, before melting. The melting may be by, e.g., a conventional solder reflow process. Any layers between the bump and the nickel-containing layer, e.g., gold or palladium, are expected to be substantially consumed by and dissolved into the solder melt. In some embodiments the solder bump after melting includes Cu with a concentration in a range of about 0.5 wt % to about 4 wt %. In some embodiments the solder bump has a diameter of about 100 µm, and the copper-containing layer has a thickness in a range of about 0.5 µm to about 2 µm.

Finally, FIG. 8 illustrates a method 800 of forming, e.g., the embodiments of FIGS. 6A and 6B. In a step 810, an electronic device substrate is provided that has a solder bump pad located thereover. Such a substrate may be, e.g., an integrated circuit or a device package. In a step 820, a copper-containing layer is formed on the solder bump. The solder bump may remain solid when the copper-containing layer is formed.

In some embodiments, the method 800 continues with a step 830, in which the solder bump is melted, thereby forming a (Ni,Cu)/Sn IMC region between the solder bump and the bump pad. The solder bump may be placed in contact with a nickel-containing layer prior to the melting. Optionally, the solder bump may be reflowed after forming the copper-containing layer thereon, but before placing the solder bump in contacts with a nickel-containing layer. The concentration of Cu in the IMC region may be in a range of about 55 wt % to about 65 wt %. In some embodiments the substrate is an IC die, while in some other embodiments the substrate is a device package substrate. The copper-containing layer may be formed by electroplating or from copper paste, e.g. In some embodiments the mass of Cu formed on the bump is in a range of about 0.5% to about 4% of the mass of the solder bump prior to incorporating the Cu therein.

Those skilled in the art to which this application relates will appreciate that other and further additions, deletions, substitutions and modifications may be made to the described embodiments.

What is claimed is:

1. An electronic device, comprising:
   an electronic device substrate having a bump pad located thereover, said bump pad including top and side surfaces;
   an elemental nickel layer located over said top and side surfaces of said bump pad such that said bump pad is located between portions of said elemental nickel layer that are located over said side surfaces;
   a solder bump on said elemental nickel layer, wherein said solder bump is composed of an alloy of silver, tin and copper, said copper having a concentration in a range of about 0.5 wt % to about 4 wt %; and
   an intermetallic compound layer between said elemental nickel layer and said solder bump, wherein intermetallic compound layer includes:
   a first intermetallic compound sublayer adjacent to said solder bump, said first intermetallic compound sublayer composed of an alloy of nickel, copper and tin, and
   a second intermetallic compound sublayer adjacent to said first intermetallic compound sublayer and said elemental nickel layer, said second intermetallic compound sublayer composed of an alloy of nickel and tin.

2. The device of claim 1, wherein said electronic device substrate is an integrated circuit die.

3. The device of claim 1, wherein said electronic device substrate is a device package substrate.

4. The device of claim 3, wherein said electronic device includes an integrated circuit substrate connected to said device package substrate by said solder bump.

5. The device of claim 1, wherein said intermetallic compound layer has a thickness in a range of about 0.5 µm to about 2 µm.

6. The device of claim 1, wherein the electronic device substrate is a first substrate and said device further comprises a second electronic device substrate, wherein said first and second substrates are coupled together by said solder bump.

7. The device of claim 1, wherein said intermetallic layer is located over a portion less than an entirety of said top surface.

8. The device of claim 1, wherein said intermetallic compound layer has a total mass that is about 0.1% to about 10% of a total mass of said solder bump.

9. The device of claim 1, wherein said copper of said solder bump is uniformly distributed throughout said solder bump.

10. The device of claim 1, wherein said alloy of nickel, copper and tin of said first intermetallic compound sublayer includes atomic ratios of about five atoms of said tin to about six atoms of said nickel plus said copper, and, more of said copper atoms than of said nickel atoms.

11. The device of claim 1, wherein said alloy of nickel, copper and tin of said first intermetallic compound sublayer includes a concentration of said copper in a range of about 55 wt % to about 65 wt %.

12. The device of claim 1, wherein the alloy of silver, tin and copper of said solder bumper includes said tin and said silver in a weight ratio of about 96:3.

13. An electronic device, comprising:
an electronic device substrate having a bump pad located thereover, said bump pad including top and side surfaces;
a elemental nickel layer located over said top and side surfaces of said bump pad such that said bump pad is located between portions of said elemental nickel layer that are located over said side surfaces;
a solder bump located over said elemental nickel layer, wherein said solder bump is composed of an alloy of silver, tin and copper, and
an intermetallic compound layer located between and in contact with said elemental nickel layer and said solder bump, wherein said intermetallic compound layer includes:
a first intermetallic compound sublayer adjacent to said solder bump, said first intermetallic compound sublayer composed of an alloy of nickel, copper and tin, and
a second intermetallic compound sublayer adjacent to said first intermetallic compound sublayer and said nickel-containing layer, said second intermetallic compound sublayer composed of an alloy of nickel and tin.

14. An electronic device comprising:
an electronic device substrate having a bump pad located thereover, said bump pad including top and side surfaces;
a nickel-containing layer located over said top and side surfaces of said bump pad such that said bump pad is located between portions of said nickel-containing layer that are located over said side surfaces;
a solder bump located over said nickel-containing layer, wherein said solder bump is composed of an alloy of silver, tin and copper, said copper having a concentration in a range of about 0.5 wt % to about 4 wt %, and
an intermetallic compound layer located between and in contact with said nickel-containing layer and said solder bump, wherein said intermetallic compound layer includes:
a first intermetallic compound sublayer adjacent to said solder bump, said first intermetallic compound sublayer composed of an alloy of nickel, copper and tin, and
a second intermetallic compound sublayer adjacent to said first intermetallic compound sublayer and said nickel-containing layer, said second intermetallic compound sublayer composed of an alloy of nickel and tin.

15. The device of claim 14, wherein said intermetallic layer is located on and forms an interface with said nickel-containing layer.

16. An electronic device, comprising:
an electronic device substrate having a bump pad located thereover, said bump pad including side surfaces and a planar top surface comprising Al or Cu;
a nickel-containing layer located on and forming an interface with said top and side surfaces of said bump pad;
a solder bump located over said nickel-containing layer, wherein said solder bump is composed of an alloy of silver, tin and copper; and
an intermetallic compound layer located between and in contact with said nickel-containing layer and said solder bump, wherein said intermetallic compound layer includes:
a first intermetallic compound sublayer adjacent to said solder bump, said first intermetallic compound sublayer composed of an alloy of nickel, copper and tin, and
a second intermetallic compound sublayer adjacent to said first intermetallic compound sublayer and said nickel-containing layer, said second intermetallic compound sublayer composed of an alloy of nickel and tin.

17. The device of claim 16, wherein said intermetallic compound layer layer is located on and forms an interface with said nickel-containing layer.

18. The device of claim 16, wherein said electronic device substrate is an integrated circuit die.

19. The device of claim 16, wherein said electronic device substrate is a device package substrate.

20. The device of claim 19, wherein said electronic device includes an integrated circuit substrate connected to said package substrate by said solder bump.

21. The device of claim 16, wherein said intermetallic compound layer has a thickness in a range of about 0.5 µm to about 2 µm.

22. The device of claim 16, wherein said electronic device substrate is a first substrate and said electronic device further comprises a second electronic device substrate, wherein said first and second electronic device substrates are coupled together by said solder bump.

23. The device of claim 16, wherein said first intermetallic compound layer is located over a portion less than an entirety of said top surface.

* * * * *